United States Patent
Finarov

Patent Number: 6,038,029
Date of Patent: Mar. 14, 2000

[54] METHOD AND APPARATUS FOR ALIGNMENT OF A WAFER

[75] Inventor: Moshe Finarov, Rehovot, Israel

[73] Assignee: Nova Measuring Instruments, Ltd., Rehovot, Israel

[21] Appl. No.: 09/097,298

[22] Filed: Jun. 12, 1998

[30] Foreign Application Priority Data

Mar. 5, 1998 [IL] Israel ......................................... 123575

[51] Int. Cl.⁷ .................................................. G01B 11/00
[52] U.S. Cl. ........................................................... 356/399
[58] Field of Search ................................... 356/385, 394, 356/400, 399, 375; 250/559.3, 559.29

[56] References Cited

U.S. PATENT DOCUMENTS

| | | | |
|---|---|---|---|
| 4,308,586 | 12/1981 | Coates | 364/525 |
| 4,328,553 | 5/1982 | Fredriksen et al. | 364/559 |
| 4,475,122 | 10/1984 | Green | 358/101 |
| 4,516,855 | 5/1985 | Korth | 356/367 |
| 4,555,767 | 11/1985 | Case et al. | 364/563 |
| 4,585,348 | 4/1986 | Chastang et al. | 356/369 |
| 4,618,262 | 10/1986 | Maydan et al. | 356/357 |
| 4,647,207 | 3/1987 | Bjork et al. | 356/369 |
| 4,653,924 | 3/1987 | Itonaga et al. | 356/369 |
| 4,681,450 | 7/1987 | Azzam | 356/367 |
| 4,713,140 | 12/1987 | Tien | 156/626 |
| 4,815,856 | 3/1989 | Bruce | 356/357 |
| 4,826,321 | 5/1989 | Coates et al. | 356/351 |
| 4,842,410 | 6/1989 | Darrah et al. | 356/357 |
| 4,873,430 | 10/1989 | Juliana et al. | 250/225 |
| 4,908,508 | 3/1990 | Dubbeldam | 250/225 |
| 4,910,549 | 3/1990 | Sugita | 355/53 |
| 4,957,368 | 9/1990 | Smith | 356/369 |
| 4,974,919 | 12/1990 | Muraki et al. | 350/6.6 |
| 4,999,014 | 3/1991 | Gold et al. | 356/382 |
| 5,042,951 | 8/1991 | Gold et al. | 356/369 |
| 5,061,072 | 10/1991 | Folkard et al. | 356/369 |
| 5,109,430 | 4/1992 | Nishihara et al. | 382/8 |
| 5,120,966 | 6/1992 | Kondo | 250/372 |
| 5,159,412 | 10/1992 | Willenborg et al. | 356/445 |
| 5,166,752 | 11/1992 | Spanier et al. | 356/369 |
| 5,181,080 | 1/1993 | Anton et al. | 356/381 |
| 5,274,575 | 12/1993 | Abe | 364/559 |
| 5,333,052 | 7/1994 | Finarov | 356/369 |
| 5,420,680 | 5/1995 | Isobe et al. | 356/128 |
| 5,438,209 | 8/1995 | Yamamoto et al. | 250/559.29 |
| 5,438,413 | 8/1995 | Mazor et al. | 356/363 |
| 5,604,344 | 2/1997 | Finarov | 250/201.3 |
| 5,682,242 | 10/1997 | Eylon | 356/401 |
| 5,825,913 | 10/1998 | Rostami et al. | 382/151 |

FOREIGN PATENT DOCUMENTS

| | | |
|---|---|---|
| 0558 781 A1 | 9/1993 | European Pat. Off. . |
| 59-125009 | 7/1984 | Japan . |
| 01 054 207 | 6/1989 | Japan . |

OTHER PUBLICATIONS

Ausschnitt, C.P., and Lagus, M.E., "Seeing the forest for the trees: a new approach to CD control," SPIE, vol. 3332, pp. 212–220 (1998).

Equipe Technologies, DBM 2400 Series Dual–Arm Robots for 300mm Wafers–Technical Literature (1 page).

Cybec Systems, Per4Mer 6100 Robot–Technical Literature, Sep. 1998 (1 page).

*Primary Examiner*—Frank G. Font
*Assistant Examiner*—Tu T. Nguyen
*Attorney, Agent, or Firm*—Skjerven, Morrill, MacPherson, Franklin & Friel LLP

[57] ABSTRACT

A semiconductor production tool which provides alignment of a wafer at a fab station thereof includes an optical system, a wafer translation mechanism, a field of view translation unit and a unit for determining alignment. The optical system has a field of view which views the wafer. The wafer translation mechanism at least brings the wafer to a predetermined measurement location. In the present invention, the field of view translation unit translates the field of view relative to the wafer so as to view at least a portion of an edge of the wafer during an alignment operation. The unit for determining alignment is operative during the alignment operation and determines the alignment of the wafer from images produced by the optical system when the optical system views at least a portion of the marker.

15 Claims, 8 Drawing Sheets

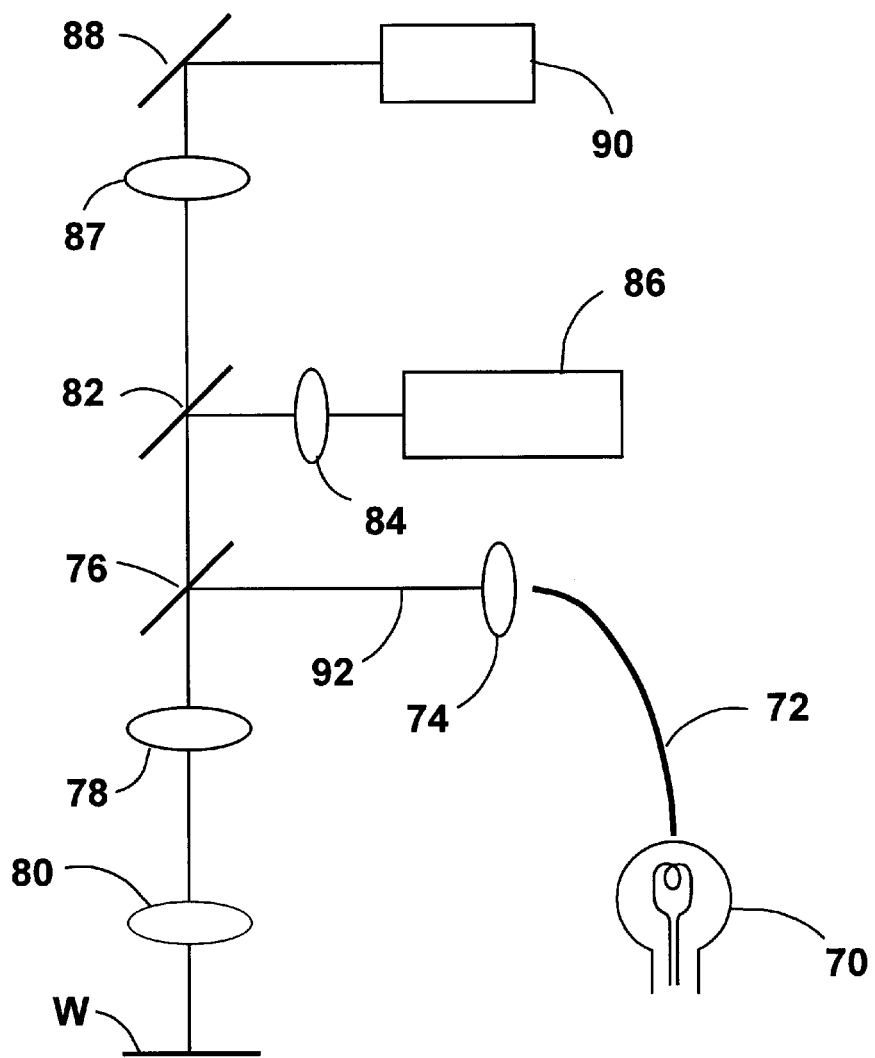

METHOD AND APPARATUS FOR ALIGNMENT OF A WAFER

FIELD OF THE INVENTION

The present invention relates to semiconductor processing generally and to methods of wafer alignment on semiconductor production tools used in semiconductor fabrication plants in particular.

BACKGROUND OF THE INVENTION

In many types of semiconductor production tools, it is very important to align the semiconductor wafer with respect to internal positioning and/or imaging systems. The alignment usually requires calculation of two main parameters: wafer orientation and wafer center displacement. Wafer orientation is usually measured with the help of a marker on the wafer, such as a flat or a notch, which is oriented to certain crystallographic axes on the silicon substrate.

Reference is now briefly made to FIGS. 1A, 1B and 1C. FIGS. 1A and 1B illustrate wafers with a notch 10 and a flat 12, respectively, and FIG. 1C details the structure of a notch, as defined by the Semiconductor Equipment and Materials International (SEMI) standards for wafer shape. FIG. 1A has a circle 14 indicating the outer periphery on the wafer within which processing or inspection can occur. The small notch 10 is present outside of the circle 14 and is aligned to an orientation or fiducial axis 16 of the wafer. FIG. 1B indicates that the flat 12 is also aligned to the orientation axis 16.

FIG. 1C indicates that the notch 10 has two lines 20 and 22 at 90° to each other and the angle therebetween is bisected by the orientation axis 16. The two lines 20 and 22 do not meet at a point; rather, they are joined by a curve 24.

There are two common approaches for wafer alignment in semiconductor manufacturing.

The first approach recognizes the pattern features, such as scribe lines, on a wafer. Such a method is described in U.S. Pat. No. 5,682,242 and is based on the fact that the patterns laid down on the wafer are accurately aligned to the center and axes of the wafer. This method generally allows successful and accurate alignment except when optical contrast or resolution is not good enough to recognize the pattern features or when a non-patterned wafer, such as a test or a monitor wafer, is to be aligned.

Alignment of non-patterned wafers is often required during production and processing, especially for metrology and inspection equipment, because, in some processes, e.g. chemical-mechanical polishing (CMP), the accurate location of the measurement point is important for recognition of inherent process non-uniformity.

The second and most common approach requires an additional station prior to the measurement or inspection station of the same equipment. This is shown in FIG. 2 to which reference is now briefly made.

Production tools, such as a measurement tool, typically have three stations, a cassette station 30 for receiving the cassettes from another piece of equipment, a pre-aligner 32 which orients the wafer by finding the marker (i.e. notch or flat), and a measurement unit 34 which performs the measurement operation. A robot 36 carries the wafer to be inspected from the cassette station 30 to the pre-aligner 32, where the wafer is oriented, and then to the measurement unit 34.

One prior art notch finder, described in U.S. Pat. No. 5,438,209, is shown in FIG. 3, to which reference is now made. FIG. 3 is a copy of FIG. 2 of U.S. Pat. No. 5,438,209.

The wafer W is placed on a table 1 and is step-wise rotated by a stepper motor 2. A CCD line sensor 3 is placed along the edge of the wafer W and below it for detecting the outline of the wafer W. A light source 4 and an optical system 5 are arranged above the wafer W to illuminate the wafer and the CCD line sensor 3. In addition, the system contains image processing and CPU units which are not presented in FIG. 3.

Stepper motor 2 initially rotates the wafer with a relatively broad pitch and a relatively high speed. Since the image received by the CCD sensor 3 changes when the notch passes the detection means, the notch region is identified. Thereafter, the stepper motor 2 slowly rotates the wafer with a fine pitch so that the outer peripheral positional data in the vicinity of the notch region can be finely sampled. The position of the notch is computed from the outer peripheral positional data and defines, in turn, the wafer's orientation and its center position.

This approach has two main disadvantages. The first is that moving the wafer from the pre-aligner 32 (FIG. 2) to the measurement station 34 causes loss of accuracy due to the mechanical tolerances of any delivery system, such as robot 36; the accuracy of the robot 36 is typically less than that of the pre-aligner 32 which is based on image processing. The second disadvantage is that the additional station requires additional footprint which is not always available, especially when the metrology tool is to be integrated within a processing unit.

SUMMARY OF THE INVENTION

The term "semiconductor production tools" will refer hereinbelow to production tools found in semiconductor fabrication plants and will include at least processing, inspection and metrology systems. The term "fab-related operation" will refer hereinbelow to operations performed in semiconductor fabrication plants, where processing, metrology and inspection are exemplary operations. The term "fab station" will refer hereinbelow to a station at which a fab-related operation occurs.

Applicant has realized that most semiconductor production tools, whether for patterned or for non-patterned wafers, have many sub-systems which can also be used for wafer alignment. For example, the semiconductor production tool might include a wafer positioning unit, an image acquisition unit and an image processing unit, all of which also form part of prior art wafer alignment units.

Applicants has realized that the fab station can also be utilized for wafer alignment.

There is therefore provided, in accordance with a preferred embodiment of the present invention, a semiconductor production tool which provides alignment of a wafer at a fab station thereof. The fab station includes an optical system, a wafer translation mechanism, a field of view translation unit and a unit for determining alignment. The optical system has a field of view which views the wafer. The wafer translation mechanism at least brings the wafer to a predetermined measurement location. In the present invention, the field of view translation unit translates the field of view relative to the wafer so as to view at least a portion of an edge of the wafer during an alignment operation. The unit for determining alignment is operative during the alignment operation and determines the alignment of the wafer from images produced by the optical system when the optical system views at least a portion of the marker.

Additionally, in accordance with a preferred embodiment of the present invention, the unit for determining alignment includes pattern recognition unit which recognizes the pattern of the marker and an alignment unit which determines the alignment of the wafer from the output of the pattern recognition unit.

Moreover, in accordance with a preferred embodiment of the present invention, the device also includes a movable pre-alignment unit located apart from the measurement location. For example, the pre-alignment unit includes a marker detector, such as an opto-couple detector, for detecting the general location of the marker.

Further, in accordance with a preferred embodiment of the present invention, the device can include an illuminator which, during alignment, illuminates the surface of the wafer edge opposite to the surface viewed by the optical system.

Still further, in accordance with a preferred embodiment of the present invention, the wafer translation mechanism includes a rotation unit operative when the wafer is in the pre-alignment unit.

Moreover, in accordance with a preferred embodiment of the present invention, the optical system includes a CCD camera.

Finally, in accordance with a preferred embodiment of the present invention, the fab station includes an optical window whose diameter is larger than the diameter of the wafer through which the optical system views the wafer.

There is also provided, in accordance with a preferred embodiment of the present invention, a method for determining the alignment of a wafer which has a marker thereon. The method includes the steps of bringing a wafer to a fab station, holding the wafer at a predetermined measurement location, translating the field of view of an optical system near an edge of the wafer until the optical system views at least a portion of the marker, acquiring images by the optical system and determining the alignment of the wafer from those of the images produced when the optical system views the at least a portion of the marker.

Additionally, in accordance with a preferred embodiment of the present invention, the method includes, after the step of bringing, the step of pre-aligning the wafer at a movable pre-alignment unit located apart from the measurement location. The step of pre-aligning typically includes the step of detecting the general location of the marker after which the field of view of the optical system is translated to the general location of the marker.

BRIEF DESCRIPTION OF THE DRAWINGS

The present invention will be understood and appreciated more fully from the following detailed description taken in conjunction with the appended drawings in which:

FIG. 6 is a schematic illustration of an optical path of an exemplary thin film thickness system which can be implemented in the fab station of the present invention;

DETAILED DESCRIPTION OF THE PRESENT INVENTION

Figure 4:
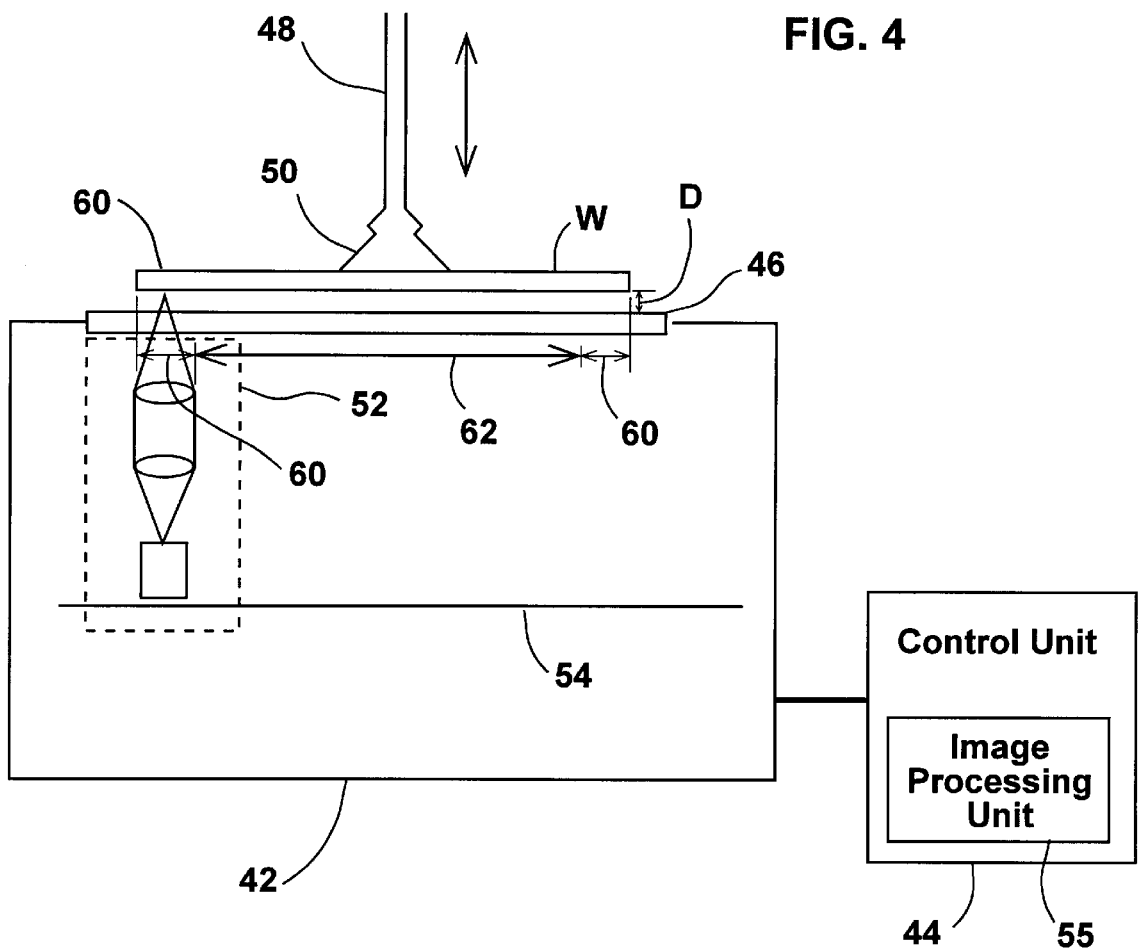
FIG. 4 is a schematic illustration of a fab station also performing alignment, construed and operative in accordance with a preferred embodiment of the present invention.
Figure 5:
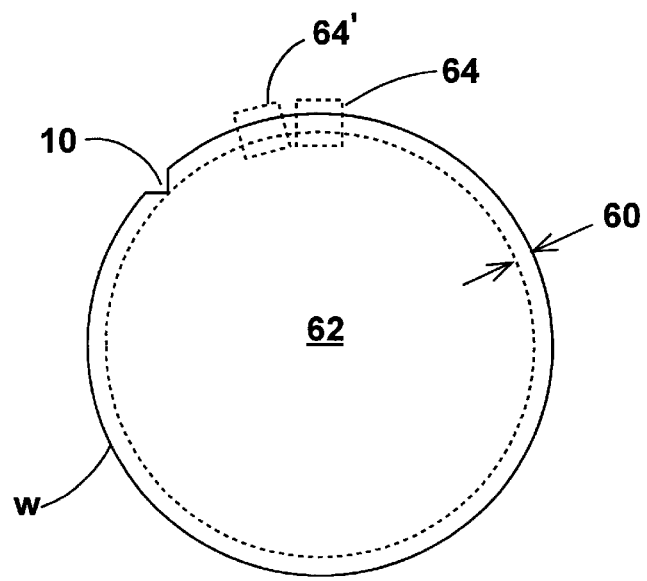
FIG. 5 is a top view of a wafer indicating alignment and fab operation areas, useful in understanding the operation of the station of FIG. 4.

Reference now is made to FIG. 4 which illustrates a first preferred embodiment of the present invention, to FIG. 5 which details its operation on a wafer to be aligned and to FIG. 6 which details the optical path of the present invention.

FIG. 4 shows the fab station of a semiconductor production tool which also performs alignment, where the exemplary operation in FIG. 4 is metrology. The metrology station can be any metrology station, such as the Integrated Thickness Monitor System called NOVASCAN 210, commercially available from Nova Measurement Systems Ltd. of Israel. The present invention will be described using the metrology station, which measures the thickness of thin films on the surface of a wafer, as an exemplary embodiment; it will be appreciated that the principles of the present invention can be implemented in any semiconductor production tool which uses image acquisition and processing.

In general, the metrology station of FIG. 4 comprises an optical measurement system 42 and a control unit 44, which controls the movement and image acquisition of the optical measurement system 42. If the optical measurement system 42 views the wafer from below, as in the NOVASCAN 210 ITM, the metrology station includes an optical window 46.

Figure 2:
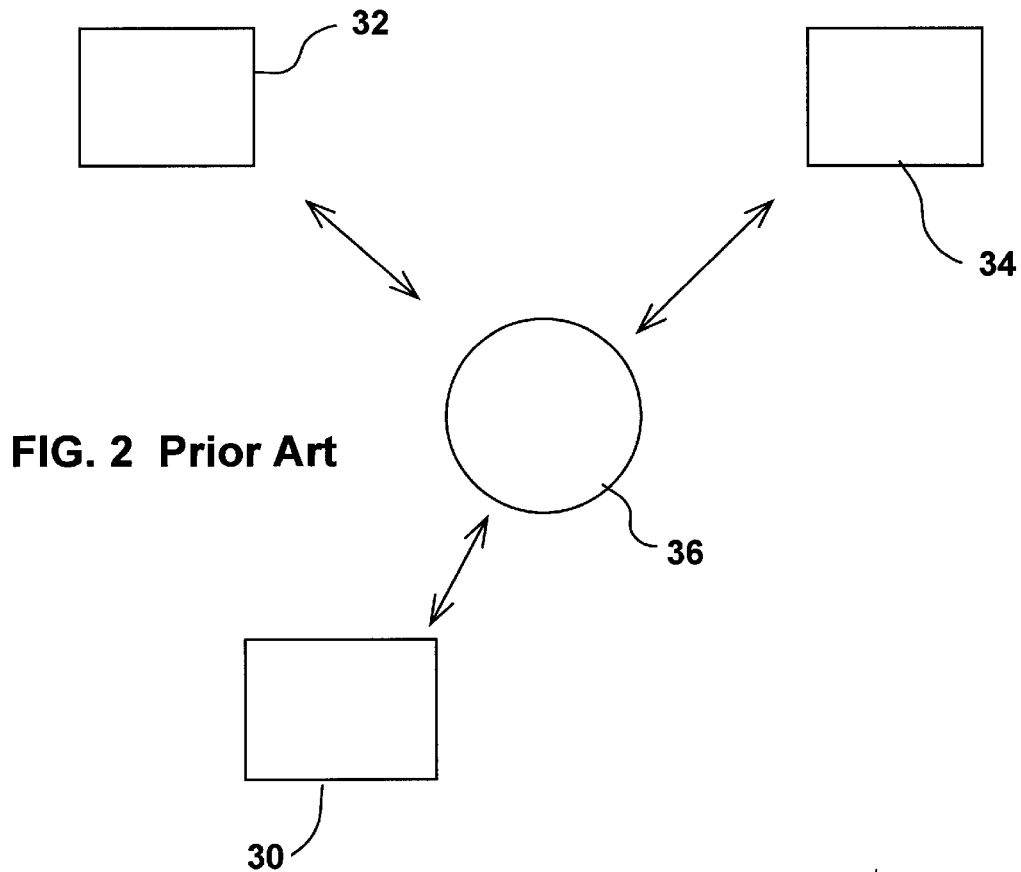
FIG. 2 is a schematic illustration of the stations of an inspection or metrology unit.
Figure 3:
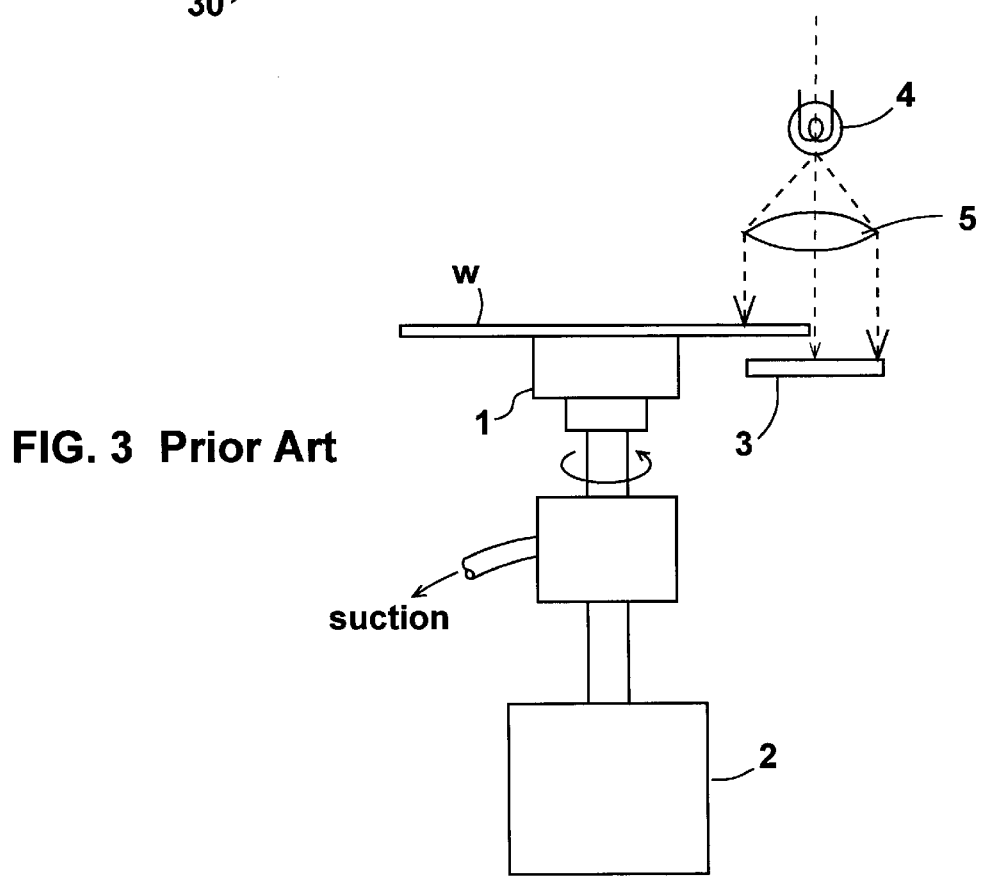
FIG. 3 is a schematic illustration of a prior art notch finder.

The wafer W is typically brought to the station via a robotic arm (not shown), such as the robot 36 of FIG. 2, and then to the measurement position by a gripper 48 having a vacuum chuck 50, with which it holds the wafer W at a measurement location. For the NOVASCAN 210 ITM system, gripper 48 holds the wafer W in a water bath at a predetermined height D above optical window 46. It will be appreciated that the gripper 48 must be of the type to hold the wafer W in a stable position. Such a gripper is found on the NOVASCAN 210 ITM system.

Optical measurement system 42 typically comprises an optical unit 52, whose optical path is shown in detail in FIG. 6, a translation system 54, such as an X-Y stage, and an image processing unit 55 forming part of the control unit 44. Since FIG. 4 is a side view, only one dimension of the X-Y stage 54 is shown; however, it will be appreciated that the translation system 54 moves the at least some of the optical elements of the optical unit 52 in two dimensions under the wafer W.

Unlike prior art stations, the fab station of the present invention performs both alignment of the wafer and the fab-related operation of the semiconductor production tool. As shown in FIG. 5 which is a top view of the wafer W, the alignment occurs along the edges of wafer W, in the area referenced 60, while the fab-related operation occurs in the central area, referenced 62, of wafer W. FIG. 4 also indicates the two areas.

During the alignment procedure, the translation system 54 (FIG. 4) finely scans the relevant optical elements along the edge area 60 of the wafer, viewing a small section 64 of the wafer's edge at a time. The size of section 64 is defined by the field of view of the image processing unit 55. The image processing unit 55 processes the data from each section 64 to determine if the marker (shown here as a notch 10) has appeared within the current section 64. If not, the translation system 54 moves the relevant optical elements further along the edge area 60, as indicated by second section 64'.

Image processing unit 55 can identify the notch by any suitable method. For example, the image processing unit 55 can include pattern recognition elements which recognize the shape of the notch. For other metrology systems, additional pattern recognition units might need to be added. However, they use the images produced by the optical measurement system 42 as input.

Figure 1A:
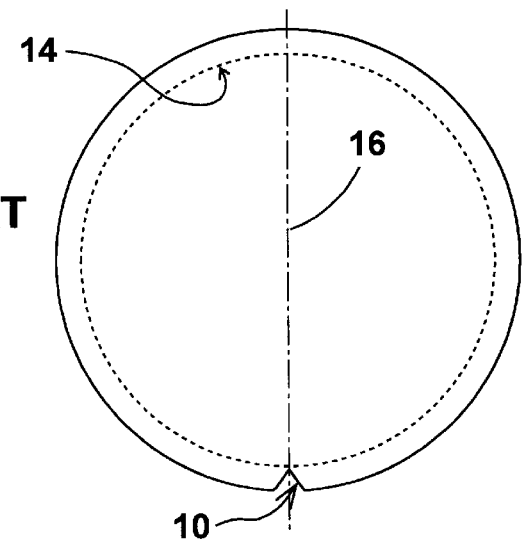
FIGS. 1A and 1B are schematic illustrations of wafers with a notch marker and a flat marker, respectively.
Figure 1B:
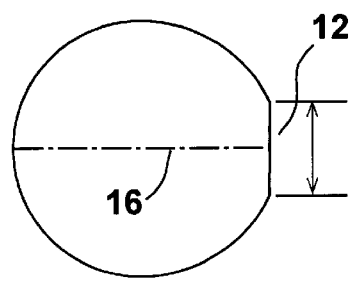
Figure 1C:
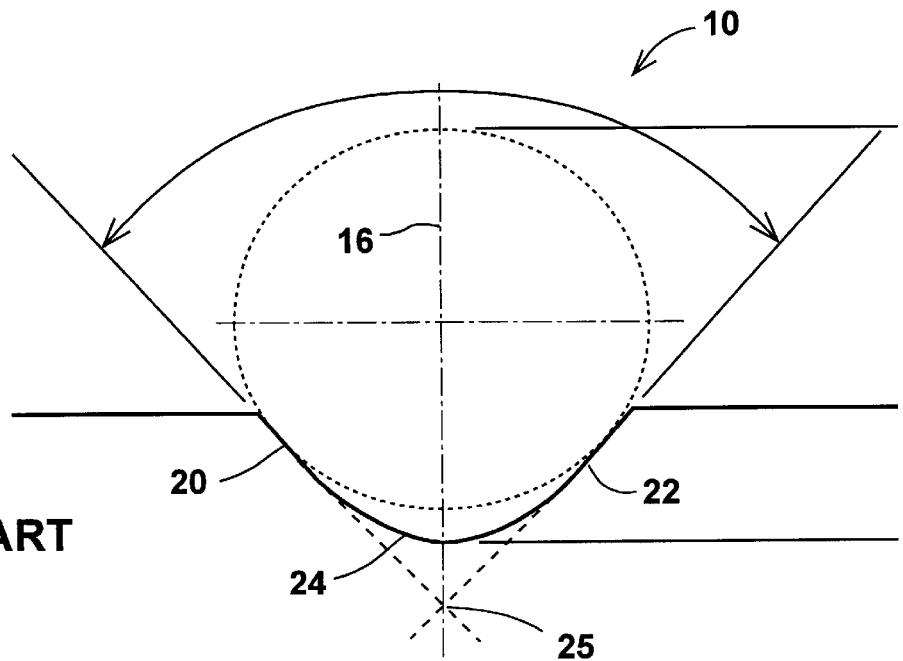
FIG. 1C is a schematic illustration of the definition of a notch.

The image processing unit 55 produces indications of the locations and directions of the lines 20 and 22 (FIG. 1C) which define the notch 10. Similar indications are produced for the flat 12. For example, for the notch 10, the lines 20 and 22 are extended back towards their intersection point, labeled 25 in FIG. 1C. The angle between lines 20 and 22 is calculated (it should be a right angle) and the location of its bisector, through intersection point 25, is determined. The line of the bisector is the orientation fiducial axis 16 of the wafer.

Another method of identifying the notch is to identify the curve 24. In this embodiment, the image processing unit 55 compares the curve in each received image with a stored reference shape of curve 24. As the field of view moves along the edge of the wafer, unit 55 searches for the image which provides maximal correlation between the received image and the stored reference shape. Unit 55 typically changes the orientation and position of the reference curve to find the maximal correlation per image and then selects the image which either provides the highest correlation or one which provides a correlation value above a predetermined threshold.

The orientation of the wafer W is thus generated and the center of the wafer can also be determined with additional calculations from the known shape of the marker, as defined by the SEMI standard. As will be appreciated, the alignment occurs while the wafer is at the fab station and the alignment is maintained for the fab-related operation, since the wafer does not move between the alignment and the fab-related operations. The fab-related operation can now commence on the portion 62 (FIG. 5) of the wafer to be operated on.

The optical path for the exemplary NOVASCAN 210 ITM is illustrated in FIG. 6 and is briefly described hereinbelow. The optical path comprises a white light source 70, an optic fiber 72, a condenser 74, which directs the light onto a beam splitter 76, a relay lens 78, a translatable objective 80 and the wafer's plane W. Behind the beam splitter 76 are located a pinhole mirror 82, a relay lens 84 and a CCD camera 86. Behind the pinhole mirror 82 there are another relay lens 87, a mirror 88 and a spectrophotometer 90. For the NOVASCAN 210 ITM, only the objective lens 80 is translated, parallel to the plane of the surface of the wafer W, typically along with some mirrors which are not functional parts of the optical path.

The beam splitter 76 receives a light beam 92 emanating from the light source 70 and deflects it toward the wafer W, via lenses 78 and 80. The reflected light beam (not labeled) is transmitted by lenses 78 and 80, passes through beam splitter 76 and is deflected by pinhole mirror 82 to the CCD camera 86 where the image acquisition takes place. The portion of the light beam which passes through the pinhole in the pinhole mirror 82 reaches the spectrophotometer 90.

It will be appreciated that the present invention has been described using the NOVASCAN 210 ITM as an example. However, the principles of the present invention can be implemented in any semiconductor production tool which operates with an image acquisition system.

Figure 7A:
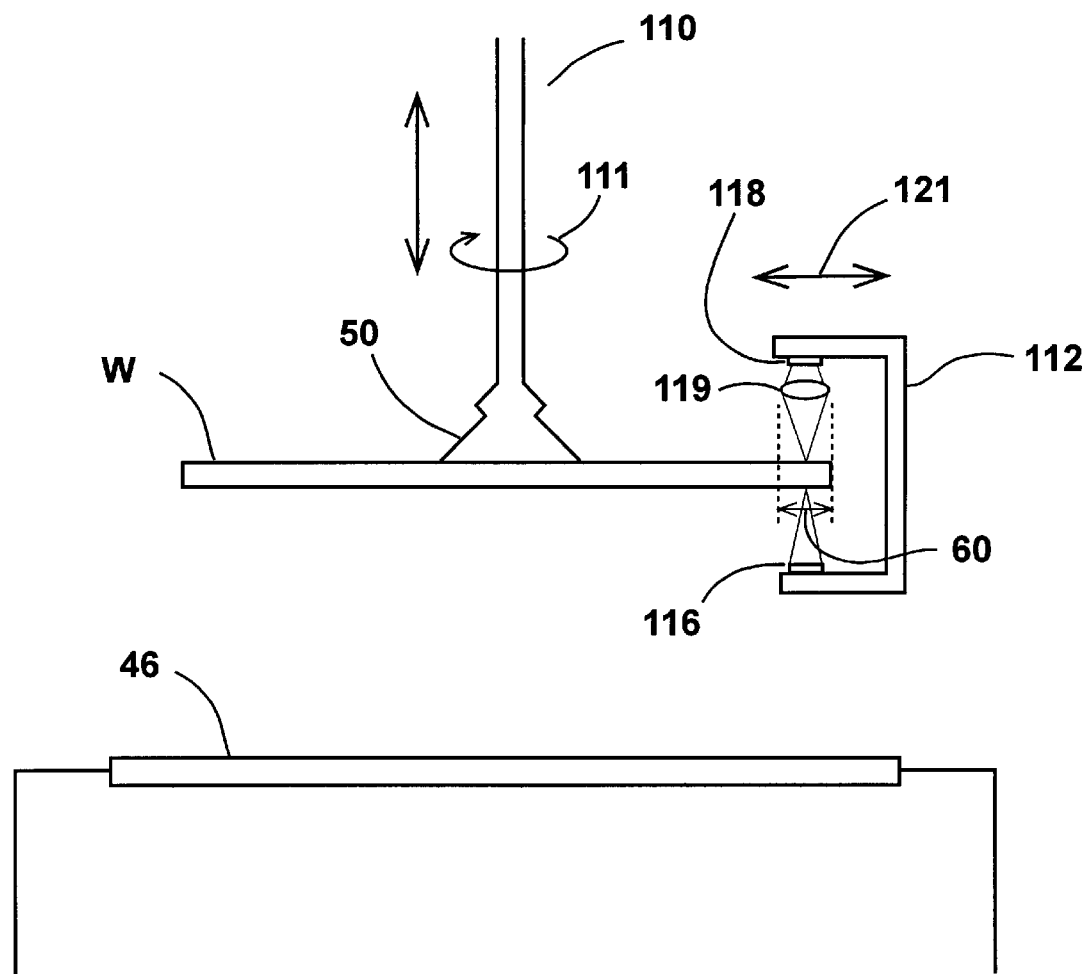
FIGS. 7A and 7B are two schematic illustrations of an alternative embodiment of the fab station of the present invention having a pre-alignment unit, in two different stages of operation.
Figure 7B:
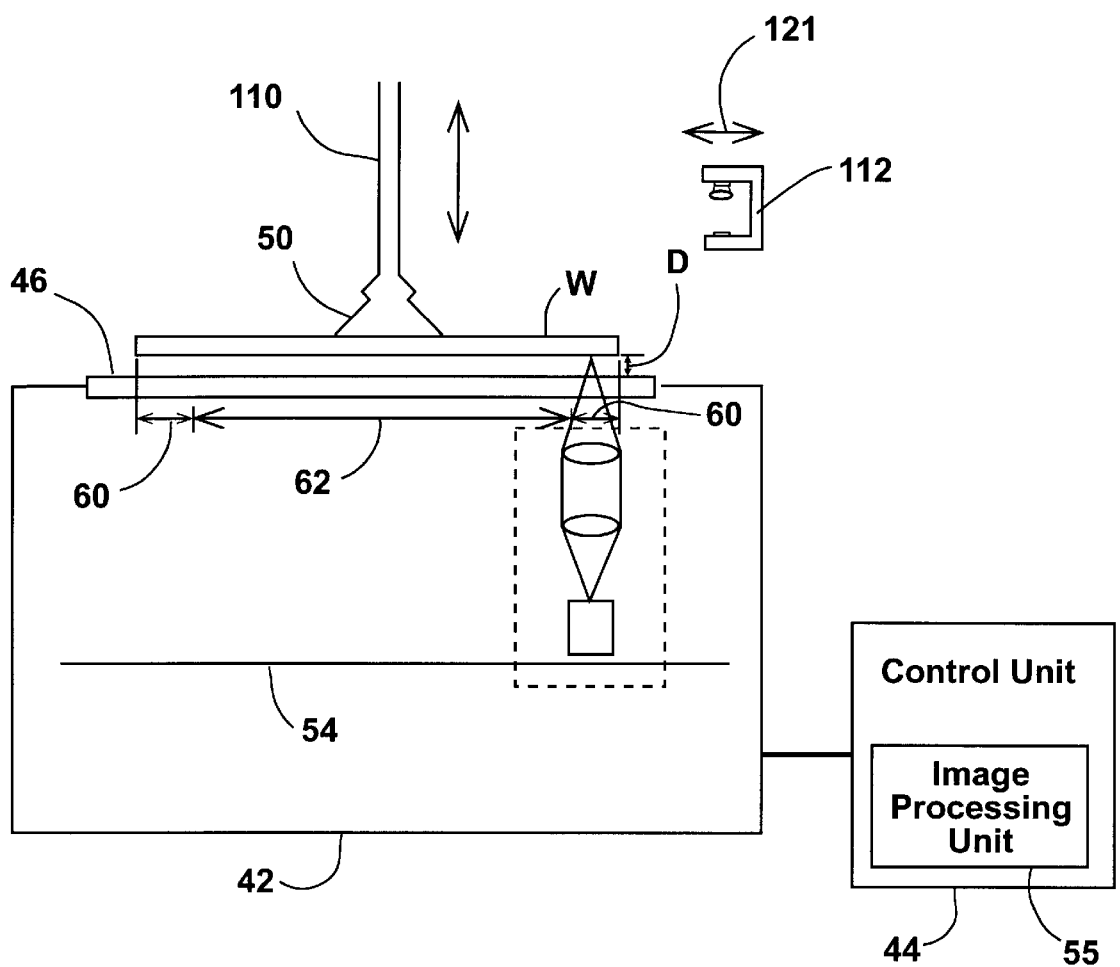
Figure 7C:
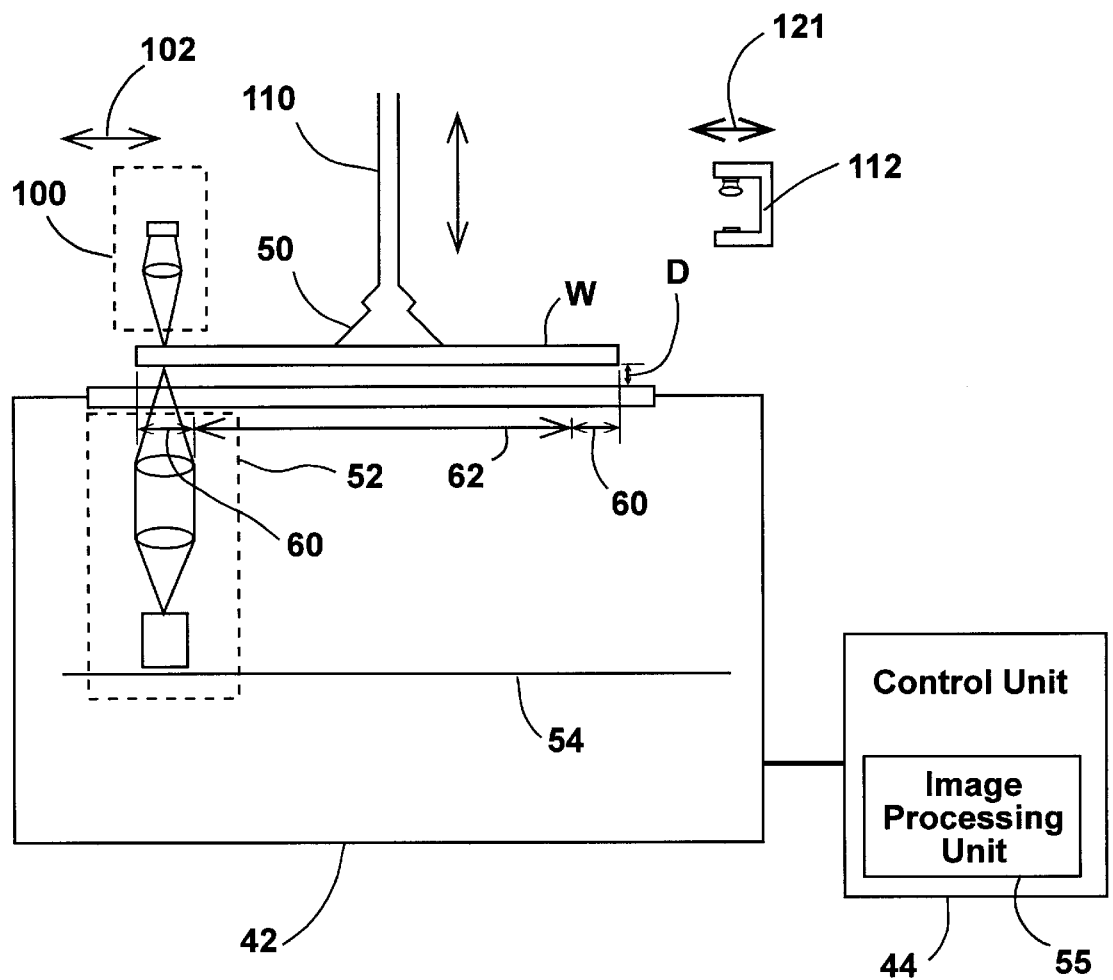
FIG. 7C is a schematic illustration, similar to FIG. 7B, with an illuminator.
Figure 8A:
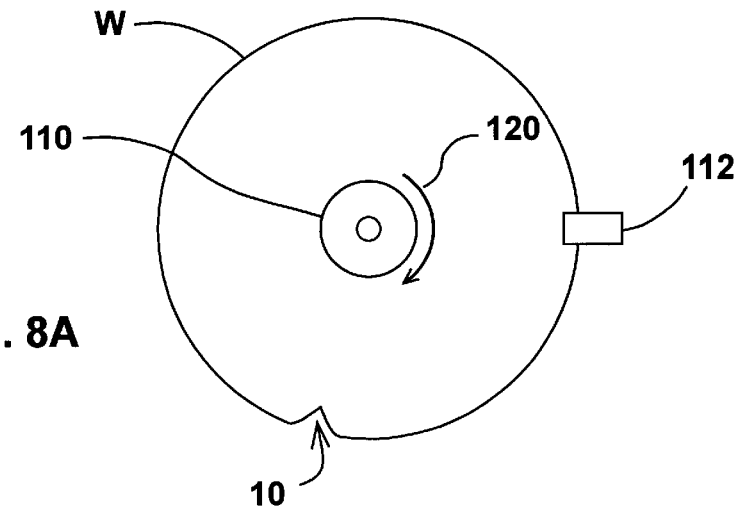
FIGS. 8A, 8B and 8C are schematic illustrations of a wafer in various stages of alignment, useful in understanding the operation of the fab station of FIGS. 7A and 7B.
Figure 8B:
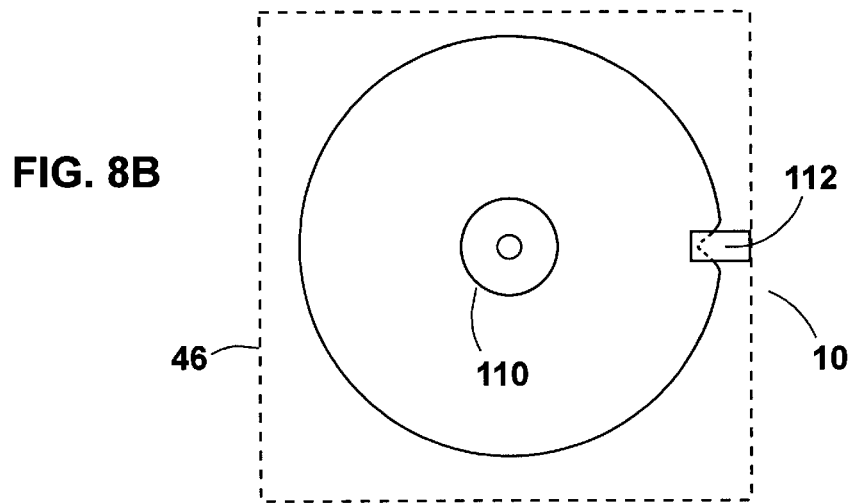
Figure 8C:
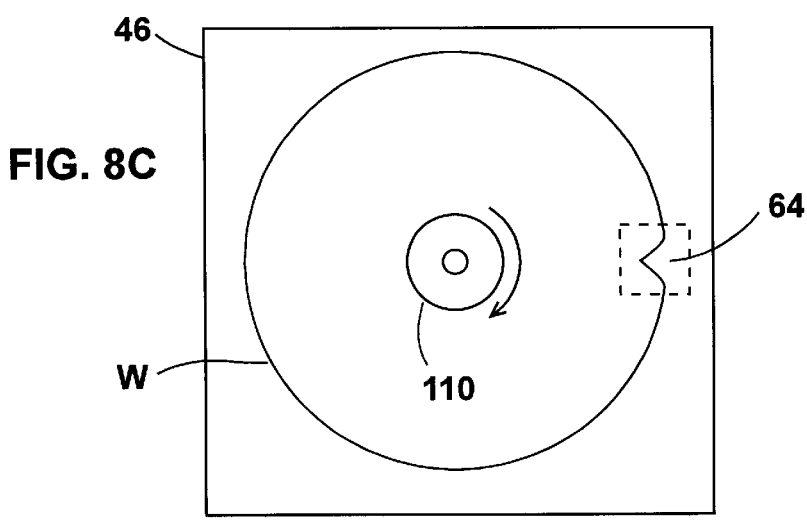

Reference is now made to FIGS. 7A, 7B, 7C, 8A, 8B and 8C which illustrate a second preferred embodiment of the present invention having a pre-alignment unit. This embodiment is useful when alignment time should be minimized. FIG. 7A illustrates a pre-alignment unit, forming part of the fab station, and its relationship to the optical window 46 (the remaining elements of the fab station are not shown), and FIGS. 7B and 7C illustrate the fab station during two different final alignment options. FIGS. 8A, 8B and 8C illustrate the wafer in an initial state (FIG. 8A), after pre-alignment (FIG. 8B) and during final alignment (FIG. 8C), where the latter two correspond to the states of FIGS. 7A and 7B. Similar reference numerals refer to similar elements.

In this embodiment, the fab station comprises a gripper 110 which rotates (arrow 111) in addition to providing vertical translation, and a pre-alignment unit, located above the optical window 46, which includes a movable opto-couple detector 112 focused on the wafer edge 60. The detector 112 comprises a point illuminator 116, such as a light emitting diode (LED), a single photodiode 118, a photodiode lens 119 and a translation mechanism, indicated by arrow 121. The translation mechanism holds the opto-couple detector 112 and moves it into and out of its place above the wafer edge.

FIG. 7A shows the opto-couple detector 112 in a first, detecting position, surrounding the edge area 60 of the wafer and FIG. 7B shows the opto-couple detector 112 in a second, non-detecting position away from view by the optical measuring system 42.

In operation, the gripper 110 brings the wafer W from a loading station to the fab station and the vacuum chuck 50 holds the wafer W at the height level of the opto-couple 112. The opto-couple detector 112 is then brought into the first position shown in FIG. 7A. FIG. 8A illustrates the original, arbitrary orientation of the wafer W. As indicated by arrow 120 in FIG. 8A, gripper 110 rotates the wafer W until the marker passes the opto-couple detector 112 which then indicates such to the control unit 44.

Specifically, the point illuminator 116 (FIG. 7A) illuminates the bottom side of the edge area 60 of the wafer W whereas the single photodiode 118 detects signals above the edge area 60. Whenever the marker is not located between the elements of the opto-couple detector 112, no light from the point illuminator 116, above a predetermined threshold level, can reach the photodiode 118. However, once the photodiode 118 detects a significant signal, i.e., the marker is between the elements of the detector 112, the control unit 44 stops the rotation of gripper 110. The wafer W is now in a generally known position, near the detector 112 as shown in FIG. 8B, although its precise orientation is still unknown.

The opto-couple detector 112 is now returned to the side of the fab station, as shown in FIG. 7B and the gripper 110 lowers the wafer W to the predetermined height D above the optical window 46, located in the objective plane of the objective 80 (FIG. 6). For the embodiment of FIG. 7B, the final alignment occurs below the detection location of the opto-couple detector 112 (FIG. 7A).

Alternatively, since the location of the marker is now approximately known, the wafer W can be rotated to bring the marker to the orientation at which the final alignment will occur. This is shown in FIG. 7C, which places the marker at a location opposite that of the opto-couple detector 112. Other locations are possible and are included in the present invention.

As shown in FIGS. 7B and 7C, the X-Y stage 54 now locates the relevant optical elements of optical unit 42 under the now known location of the marker. Together with the X-Y stage 54, optical unit 42 then scans the known vicinity of the marker. Fine scanning is conducted within a region around the marker. FIG. 8C indicates the scanning region, which is section 64, and the optical window 46 which has a larger area and diameter than the wafer W.

If desired and as shown in FIG. 7C, the fab station can include an illuminator 100 at the final alignment location and near the edge 60 of the wafer W. The illuminator 100 increases the contrast of the wafer periphery with respect to the wafer. If desired, the illuminator 100 can be translatable, as indicated by arrow 102, so that it is not in place during the fab-related operation.

An image of the marker thus is obtained by the fab station from which a generally accurate position of the wafer and its center are obtained.

It is noted that in both preferred embodiments, the final alignment of the wafer is conducted at the same position where the fab-related operation occurs.

It will be appreciated by persons skilled in the art that the present invention is not limited by what has been particularly shown and described herein above. Rather the scope of the invention is defined by the claims that follow:

I claim:

1. A semiconductor production tool which provides alignment of a wafer at a fab station thereof, the wafer including an orientation marker on its edge and the fab station including an optical system having a field of view which views said wafer, and a mechanism for moving said wafer in said tool, said tool comprising:

a prealignment unit in operative communication with said moving mechanism, said prealignment unit adapted for receiving a wafer edge and scanning said edge upon its rotation by said moving mechanism, to detect said orientation marker and provide at least one signal indicative of said marker position on said wafer;

a control unit in operative communication with said prealignment unit for receiving said at least one signal indicative of said marker position; and a fab station for receiving said wafer, said fab station including an alignment system comprising:

means for determining the alignment of said wafer from images of said wafer edge produced by said optical system when said field of view of said optical system views at least a portion of said marker, and means for translating said field of view of said optical system so as to view at least a portion of an edge of said wafer, said translating means in operative communication with said control unit such that said optical system is translated in accordance with said at least one signal.

2. The tool according to claim 1, wherein said means for determining includes pattern recognition means which recognizes the pattern of said marker and alignment means which determines the alignment of said wafer from the output of said pattern recognition means.

3. The tool according to claim 1, wherein said prealignment unit is movable with respect to said fab station.

4. The tool according to claim 1, wherein said prealignment unit comprises a marker detector for detecting the general location of said marker.

5. The tool according to claim 4, wherein said marker detector is an opto-couple detector.

6. The tool according to claim 1, additionally comprising, an illuminator which illuminates a first surface of said wafer edge, which is opposite to a second surface viewed by said optical system, during said alignment operation.

7. The tool according to claim 1, wherein said moving mechanism includes rotation means operative when said wafer is in said pre-alignment unit.

8. The tool according to claim 1, wherein said marker is selected from the group consisting: of a notch and a flat.

9. The tool according to claim 1, wherein said optical system includes a CCD camera.

10. The tool according to claim 1, wherein said fab station includes an optical window whose diameter is larger than the diameter of said wafer through which said optical system views said wafer.

11. A semiconductor production tool which provides alignment of a wafer at a fab station thereof, the wafer including an orientation marker on its edge, the tool comprising:

a wafer moving mechanism;

a prealignment unit in operative communication with said moving mechanism, said prealignment unit adapted for scanning the edge of said wafer while said wafer is rotated by said moving mechanism, to detect said orientation marker for the placement of said wafer in a predetermined orientation based on the detected location of said marker;

an optical system having a field of view which views said wafer, said optical system at least partially within said fab station;

said moving mechanism in operative communication with said fab station, that at least brings said wafer in a predetermined orientation to a predetermined measurement location of said fab station;

means for translating said field of view relative to said wafer so as to view at least a portion of an edge of said wafer in accordance with said predetermined orientation during an alignment operation and to view non-edge portions of said wafer during a lab-related operation; and means for determining the alignment of said wafer from images produced by said optical system when said optical system views at least a portion of said marker along the edge of said wafer.

12. A method for determining the alignment of a wafer which has an marker thereon, the method comprising the steps of:

prealigning a wafer by rotating said wafer, said rotation for scanning said wafer along its edges to detect a location of an orientation marker on said wafer;

bringing said wafer to a fab station;

holding said wafer at a predetermined measurement location;

translating the field of view of an optical system near an edge of said wafer until said optical system views at least a portion of said marker in accordance with said detected location of said orientation marker;

acquiring images by said optical system; and determining the alignment of said wafer from those of said images produced when said optical system views said at least a portion of said marker along the edge of said wafer.

13. The method according to claim 12, wherein said step of determining includes the step of recognizing the pattern of said marker.

14. The method according to claim 13, wherein said step of pre-aligning includes scanning the edge of said wafer to detect the general location of said marker.

15. The method according to claim 14, wherein said step of translating includes the step of translating the field of view of said optical system to the general location of said marker.

* * * * *